(12) United States Patent
Priel et al.

(10) Patent No.: US 7,689,897 B2
(45) Date of Patent: Mar. 30, 2010

(54) METHOD AND DEVICE FOR HIGH SPEED TESTING OF AN INTEGRATED CIRCUIT

(75) Inventors: Michael Priel, Hertzelia (IL); Eyal Salomon, Rishon-Lezion (IL); Amir Zatlzman, Moshav Amikam (IL)

(73) Assignee: Freescale Semiconductor, Inc., Austin, TX (US)

( * ) Notice: Subject to any disclaimer, the term of this patent is extended or adjusted under 35 U.S.C. 154(b) by 200 days.

(21) Appl. No.: 11/914,700

(22) PCT Filed: May 19, 2005

(86) PCT No.: PCT/EP2005/051637

§ 371 (c)(1),
(2), (4) Date: Nov. 16, 2007

(87) PCT Pub. No.: WO2006/123204

PCT Pub. Date: Nov. 23, 2006

(65) Prior Publication Data

US 2009/0129183 A1 May 21, 2009

(51) Int. Cl.
G11B 27/00 (2006.01)
G06F 11/00 (2006.01)
(52) U.S. Cl. ........................... 714/814; 714/744
(58) Field of Classification Search ............ None
See application file for complete search history.

(56) References Cited

U.S. PATENT DOCUMENTS

| | | | |
|---|---|---|---|
| 5,513,123 A | 4/1996 | Dey | |
| 5,524,114 A | 6/1996 | Peng | |
| 6,573,742 B2 | 6/2003 | Sim | |
| 6,598,192 B1 | 7/2003 | McLaurin | |
| 6,728,917 B2 | 4/2004 | Abramovici | |
| 7,017,096 B2 | 3/2006 | Abramovici | |
| 7,058,869 B2 | 6/2006 | Abdel-Hafez | |
| 7,131,081 B2 | 10/2006 | Wang | |
| 7,310,754 B2 * | 12/2007 | Nishida et al. | ............... 714/724 |
| 7,454,678 B2 * | 11/2008 | Cullen et al. | ................ 714/729 |

(Continued)

FOREIGN PATENT DOCUMENTS

| | | | |
|---|---|---|---|
| EP | 1271162 B1 | 10/2005 | |
| EP | 1293791 B1 | 9/2006 | |
| WO | 2004074852 A2 | 9/2004 | |

OTHER PUBLICATIONS

McLaurin et al; "The testability features of the ARM1026EJ microprocessor core"; ITC International Test Conference 2003, vol. 1, pp. 773-782.

*Primary Examiner*—Christine T Tu

(57) ABSTRACT

An integrated circuit and a method for testing an integrated circuit. The method includes providing a first high frequency clock signal sequence to a first group of components of an integrated circuit during a test sequence; characterized by receiving, by a first memory circuit within the integrated circuit, at a low reception rate, a first high frequency signal pattern information and a first low frequency signal pattern information; generating the first high frequency clock signal sequence in response to a first high frequency clock signal and in response to the first high frequency signal pattern information; wherein the first high frequency signal pattern information is being retrieved at a first high retrieval rate from the first memory circuit; and generating a first low frequency clock signal sequence in response a first low frequency clock signal and in response to the first low frequency signal pattern information; wherein the first high frequency signal pattern information is being retrieved at a low retrieval rate from the first memory circuit.

26 Claims, 5 Drawing Sheets

U.S. PATENT DOCUMENTS

2003/0021464 A1   1/2003   Takeoka et al.
2003/0084390 A1   5/2003   Tamarapalli et al.
2003/0188239 A1   10/2003  Hosokawa
2005/0066242 A1   3/2005   Wang et al.

* cited by examiner

METHOD AND DEVICE FOR HIGH SPEED TESTING OF AN INTEGRATED CIRCUIT

FIELD OF THE INVENTION

The present invention relates to methods and devices for high speed testing of integrated circuits.

BACKGROUND OF THE INVENTION

Modern integrated circuits include a very large amount of clock signal sequence circuit s such as flip flops, logic gates and the like. The design process is relatively long and includes multiple stages such as high level description, synthesis, placement and routing, extraction, static timing analysis and the like.

In order to test modern integrated circuits various Design For Testability (DFT) techniques were developed. Various DFT techniques include the following stages: (i) loading test patterns into the integrated circuit, including scan chains formed within the integrated circuit, (ii) launching a test sequence by providing one or usually multiple launch clock signals, (iii) capturing test results by providing one or more capture clock signals, and (iv) shifting out the test results.

The following U.S. patents, U.S. patent applications and articles provide a brief review on some state of the art DFT methods and devices: U.S. Pat. No. 6,728,917 of Abramovici et al., titled "Sequential test pattern generation using combinational techniques"; U.S. Pat. No. 5,513,123 of Dey et al., titled "Non-scan design-for-testability of RT-level data paths"; U.S. Pat. No. 6,598,192 of McLaurin et al. (hereinafter—"McLaurin"); U.S. patent application publication number 2004/0177299 of Wang et al., titled "Scalable scan-path test point insertion technique"; U.S. patent application publication number 2005/0066242 of Wang et al., titled "Hybrid scan-based delay testing technique for compact and high fault coverage test set"; U.S. patent application publication number 2003/0188245 of Abramovici et al., titled "Sequential test pattern generation using clock-control design for testability structures"; U.S. patent application publication number 2004/0237015 of Abdel-Hafez et al., titled "Method and apparatus for debug, diagnosis, and yield improvement of scan-based integrated circuits"; U.S. patent application publication number 2003/0188239 of Hosokawa et al., titled "Compacted test plan generation for integrated circuit testing, test sequence generation, and test"; U.S. patent application publication number 2002/0024352 of Sim, titled "Semiconductor integrated circuit with test points inserted thereto"; U.S. patent application publication number 2003/0084390 of Tamarapalli et al., titled "At-speed test using on-chip controller" (hereinafter—"Tamarapalli"); and "The testability features of the ARM1026EJ microprocessor core", T. L. McLaurin, F. Frederick, R. Slobodnik, ITC International Test Conference, 2003.

Various tests should be executed at the functional speed of the chip. These tests are also referred to as at-speed tests. The execution of these tests is relatively costly and complex, for various reasons. First, an external test device (also refereed to as Automated Test Equipment ATE) that is required to generate functional speed signals is relatively costly. Second, even if such a device exists then the pins (or associated interface circuitry) of the integrated circuit can distort the high speed signals. In many cases the core of the integrated circuit operates at a high frequency and the pins are not adapted to manage signals of such a high frequency.

Tamarapalli suggests to solve at-speed testing problems by switching between low frequency external signals that can be provided during the scanning stage of the test, and between internally generated high frequency signals. These high frequency signals are generated by an PLL circuit and are provided via a complex clock synchronizer and switching mechanism to a tested core.

McLaurin suggests to manipulate an PLL clock signal by chopping the signal such as to provide clock sequences that can include two adjacent clock signals that are very close to each other. The chopping mechanism can be controlled by a set of registers, each storing a predefined chopping sequence.

There is a need to provide an efficient system and method for high speed testing of integrated circuits.

SUMMARY OF THE PRESENT INVENTION

An integrated circuit and a method for testing an integrated circuit, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The following figures illustrate exemplary embodiments of the invention. They are not intended to limit the scope of the invention but rather assist in understanding some of the embodiments of the invention. It is further noted that all the figures are out of scale.

It is further noted that the terms "first" and "second" are used in the specification for easily distinguishing between various signals, sequences or components.

Figure 1:
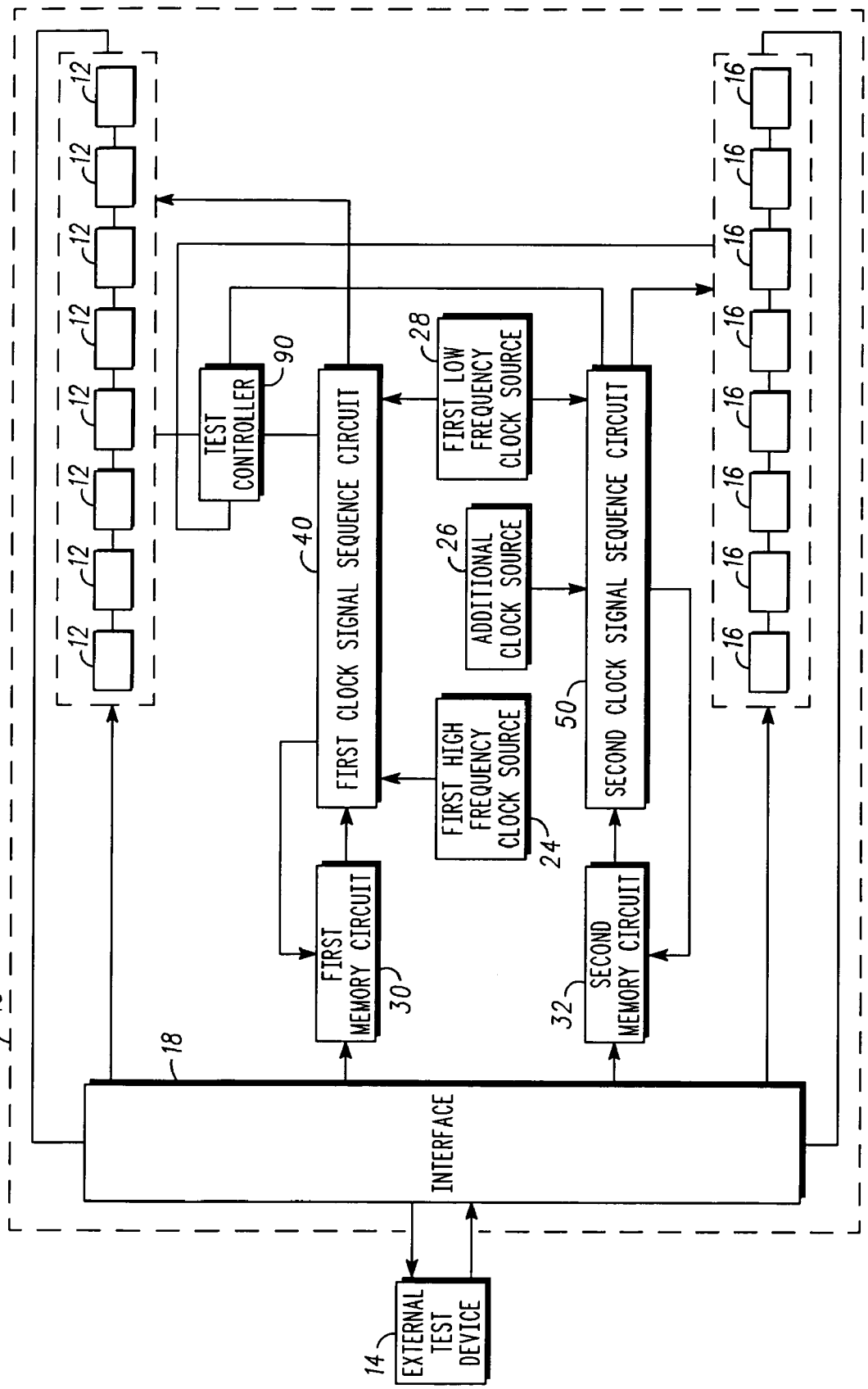
FIG. 1 illustrates an integrated circuit according to an embodiment of the invention.

FIG. 1 illustrates an integrated circuit 10 that is connected to an external test device 14, according to an embodiment of the invention.

The integrated circuit 10 includes a first group of components 12, a second group of components 16, an interface 18, a first memory circuit 30, a second memory circuit 32, a first clock signal sequence circuit 40, a second clock signal sequence circuit 50, a first high frequency clock source 24, a first low frequency clock source 28, an additional clock source 26, and a test controller 90.

The test controller 90 controls the high speed test as well as other operations or tests of the integrated circuit. It can control the scan-in, scan-out, scan enable periods, and the like. It conveniently generates a clock control signal 206 that is further illustrated in FIG. 3.

Those of skill in the art will appreciate that other configurations of integrated circuit 10 can be provided without departing from the scope of the invention. For example, the amount of different groups of components can differ from two, these components can be arranged in various manners, the different groups of components can receive clock signals of various frequencies, the amount of clock sources can differ from three, and the like.

According to another embodiment of the invention multiple clock sources such as sources 24 and 28 can be replaced by an adjustable clock source capable of generating clock signals of different frequencies.

It is assumed, for convenience of explanation, that the first group of components 12 form a scan chain and that during a high frequency test, such as an at-speed test, they receive a first high frequency clock signal sequence. This sequence can include, for example a launch clock signal and a capture clock signal.

It is also assumed, for convenience of explanation, that the second group of components 16 forms a scan chain and that during a high frequency test, such as an at-speed test, they receive a second high frequency clock signal sequence.

According to an embodiment of the invention the second group of components can receive the same high frequency clock signal sequence as the first group of components.

Conveniently, each clock signal sequence is generated by receiving a clock signal. According to an embodiment of the invention both sequences are generated from the same clock or are generated from clock sources of the same frequency.

According to another embodiment of the invention the two clock signal sequences are generated from clock signals that have different frequencies. Both clock signal frequencies can be high but this is not necessarily so.

Conveniently, each clock signal sequence includes a launch signal and a capture signal.

Conveniently, the first group of components 12 includes flip-flops, latches or other sequential logical components that are belong to a core of the integrated circuit 10.

It is noted that the integrated circuit 10 can include multiple cores that operate at the same operational frequency, or at different operational frequencies, and that each core can be associated with a different group of components that are tested during high frequency tests.

The integrated circuit 10 has an interface 18 for receiving signals from the external test device 14 and for providing signals to the external test device 14. The interface 18 usually includes integrated circuit pins and associated circuitry such as buffers, pull up or pull down resistors, analog amplifiers, and the like. Usually, the interface 18 is adapted to operate at a low frequency.

According to an embodiment of the invention multiple interfaces exist, for connecting one or more external test devices to various portions of the integrated circuit 10. Some of the interfaces can be input interfaces, others output interfaces and yet further interfaces can be bi-directional interfaces.

The first memory circuit 30 is adapted to receive at a low reception rate, a first high frequency signal pattern information and a first low frequency signal pattern information from the external test device 14, via interface 18.

It is noted that these information can be received in a consecutive manner but this is not necessarily so and intermediate periods such as idle periods can occur between a reception of the first high frequency and the first low frequency pattern information.

The first memory circuit 30 is connected to first high frequency clock source 24, to a first low frequency clock source 28 and to first clock signal sequence circuit 40. An exemplary first clock signal sequence circuit 40 is further illustrated in FIG. 2.

The low frequency information loaded by the first memory circuit 30, may be processed and fetched into the high frequency circuit to form a high speed launch and capture transition sequence in any manner.

The first clock signal sequence circuit 40 is adapted to generate a first high frequency clock signal sequence in response to (i) the first high frequency signal pattern information and to (ii) a first high frequency clock signal.

The first high frequency clock signal is provided by the first high frequency clock source 24. The first high frequency signal pattern information is retrieved at a first high retrieval rate from the first memory circuit 30.

The first clock signal sequence circuit 40 is further adapted to generate a first low frequency clock signal sequence in response to (i) the first low frequency signal pattern information and to (ii) a first low frequency clock signal.

The first low frequency clock signal is provided by the first low frequency clock source 28. The first low frequency signal pattern information is being retrieved at a low retrieval rate from the first memory circuit 30.

The first high frequency clock signal sequence is conveniently generated during high speed tests such as at-speed tests, of the integrated circuit 10, while the first low frequency clock signal sequence is generated during other periods, such as scan-in and scan-out periods, during low speed tests of the integrated circuit and the like. Conveniently, the high frequency clock signal is gated during low frequency operation of the integrated circuit 10.

The integrated circuit 10 is adapted to sequentially generate the first high frequency signal pattern information and the first low frequency pattern information. These two sequences can be separated by an idle period, but this is not necessarily so.

Conveniently, the first high frequency signal pattern information is responsive to a desired length of a high frequency test. The first high frequency clock signal pattern generated from said pattern information can include, for example a launch signal and a capture signal that are spaced apart from each other by a period that defines the high speed test period.

Conveniently, the first high frequency is at least double than the first low frequency. The ration between said frequencies can be a positive integer but this is not necessarily so.

Integrated circuit 10 also includes a second clock signal sequence circuit 50 and a second memory circuit 32 that are adapted to generate a second clock signal sequence. The second clock signal sequence circuit 50 is connected to a second group of components 16 that receives the second clock signal sequence.

Conveniently, the second clock signal sequence circuit 45 retrieves the second clock signal pattern information at a second retrieval rate that differs from the first high retrieval rate.

According to an embodiment of the invention the first group of components 12 form one or more scan chain.

Conveniently, and in order to increase the efficiency of the scan in process, the first memory circuit 30 is adapted to receive at least a portion of the first low frequency signal pattern information while retrieving at least a portion of the first high frequency signal pattern information.

According to another embodiment of the invention a first memory circuit 30 is adapted to receive, store and provide the first high frequency signal pattern information, while another memory circuit is adapted to receive, store and provide, the first low frequency signal pattern information. These memory circuits can be selectively connected to the interface 18 or and the first clock signal sequence circuit 40. In order to allow parallel or at least partially overlapping reception and provision of different types of information the output switching process can be controlled by a control signal that is time shifted to another control signal that controls the input switching process.

The first clock signal sequence circuit 40 is adapted to apply at least one binary operation on the first high frequency clock signal and the retrieved first high frequency signal pattern information to provide the first high frequency clock signal sequence. The binary operation can include various functions such as AND, OR, XOR, NOT, NAND, NOR, NXOR, as well as various multiplexing, de-multiplexing operations.

Conveniently, the first clock signal sequence circuit 40 is adapted to: (i) receive a first high frequency clock signal, (ii) receive a first low frequency clock signal, and (iii) select one out of these clock signal as a first retrieval triggering signal.

Figure 2:
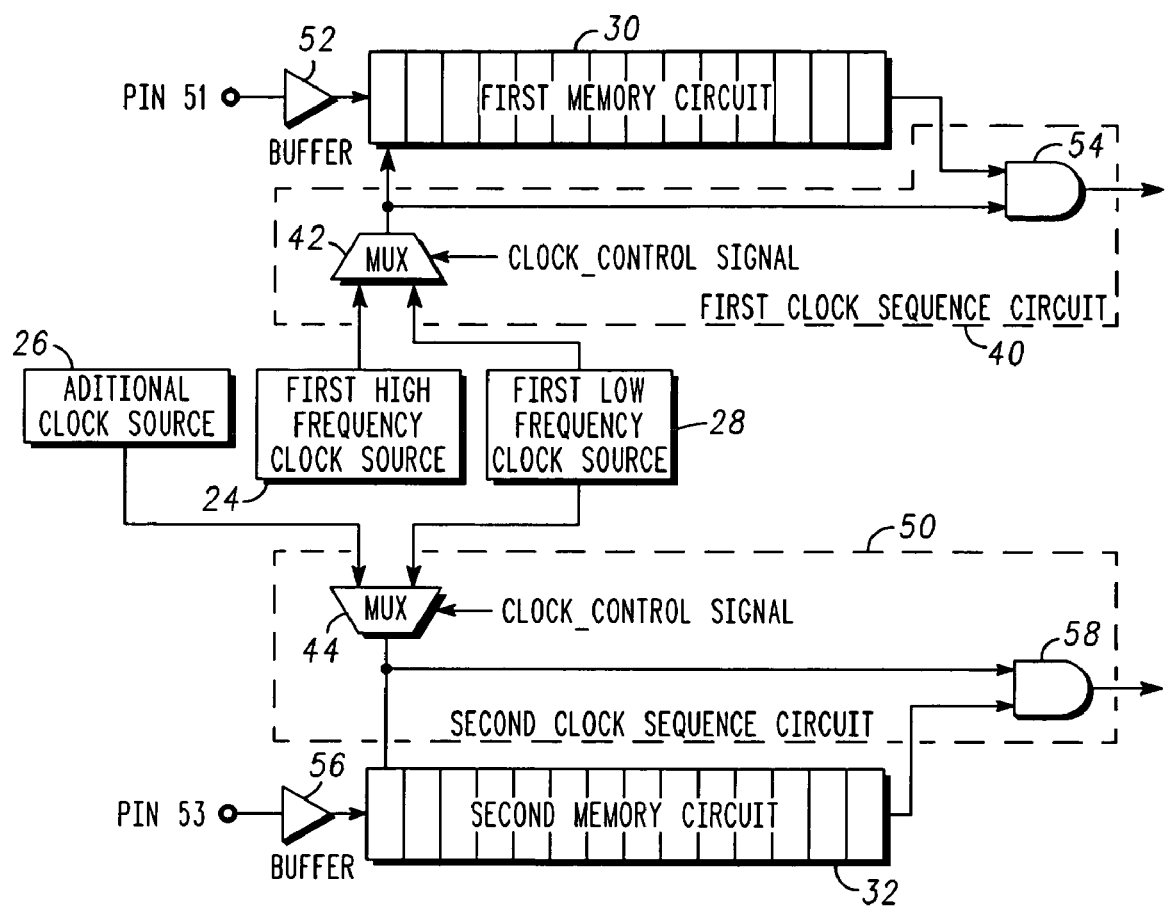
FIG. 2 illustrates in greater details two memory circuits and their environment, according to an embodiment of the invention.

FIG. 2 illustrates in greater details a first and a second memory circuits 30 and 32 and their environment, according to an embodiment of the invention.

For convenience of explanation it is assumed that the additional clock source 26 outputs a second high frequency clock signal. The second high frequency clock signal differs from the first high frequency clock signal generated by first high frequency clock source 24. This is not necessarily so. According to another embodiment of the invention the additional clock source 26 outputs low frequency clock signal.

The interface 18 is represented by two integrated circuit pins 51 and 53 and by two buffers 52 and 56. The two integrated circuit pins 51 and 53 receive signals from the external test device 14.

The first memory circuit 30 is illustrated as a first in first out (FIFO) memory circuit and the second memory circuit 32 is also illustrated as a FIFO memory circuit, but other memory circuits, such as but not limited to dual access memory elements can be used.

The data input of the first memory circuit 30 is connected to the output of buffer 52 and the clock input of the first memory circuit 30 is connected to an output of first multiplexer 42. The data input of the first memory circuit 30 receives a first high frequency signal pattern information. This information is retrieved at a retrieval rate that is determined by the first multiplexer (MUX) 42. The output signal of first multiplexer 42 is also provided to a first input of a first AND gate 54. The second input of the first AND gate 54 is connected to the output of the first memory circuit 30.

The first multiplexer 42 receives (i) a first high frequency clock signal from the first high frequency clock source 24 and (ii) a first low frequency signal from the first low frequency clock source 28.

The first multiplexer 24 is controlled by the clock control signal such as to output a first high frequency clock signal during high frequency test periods and to output a low frequency clock signal during other periods.

The first AND gate 54 outputs to the first group of components 12 the first high frequency clock signal sequence or the first low frequency clock signal sequence, depending upon the value of the clock control signal.

The data input of the second memory circuit 32 is connected to the output of buffer 56 and the clock input of the second memory circuit 32 is connected to an output of second multiplexer 44. The data input of the second memory circuit 32 receives a second high frequency signal pattern information. This information is retrieved at a retrieval rate that is determined by the second multiplexer (MUX) 44. The output signal of second multiplexer 44 is also provided to a second input of a second AND gate 54. The first input of the second AND gate 54 is connected to the output of the second memory circuit 32.

The second multiplexer 44 outputs a second high frequency clock signal during high frequency test periods and outputs a low frequency clock signal during other periods. The second multiplexer 44 is controlled by the clock control signal. It is noted that the second multiplexer 44 can be controlled by a clock control signal that differs from the clock control signal provided to the first multiplexer 42.

The second AND gate 54 outputs to the second group of components 16 the second high frequency clock signal sequence or the second low frequency clock signal sequence, depending upon the value of the clock control signal.

It is noted that the clock control signal is synchronized with the pattern information provided to the first and second memory circuits, such that during the high frequency test period the required high frequency clock signal sequence is generated.

Figure 3:
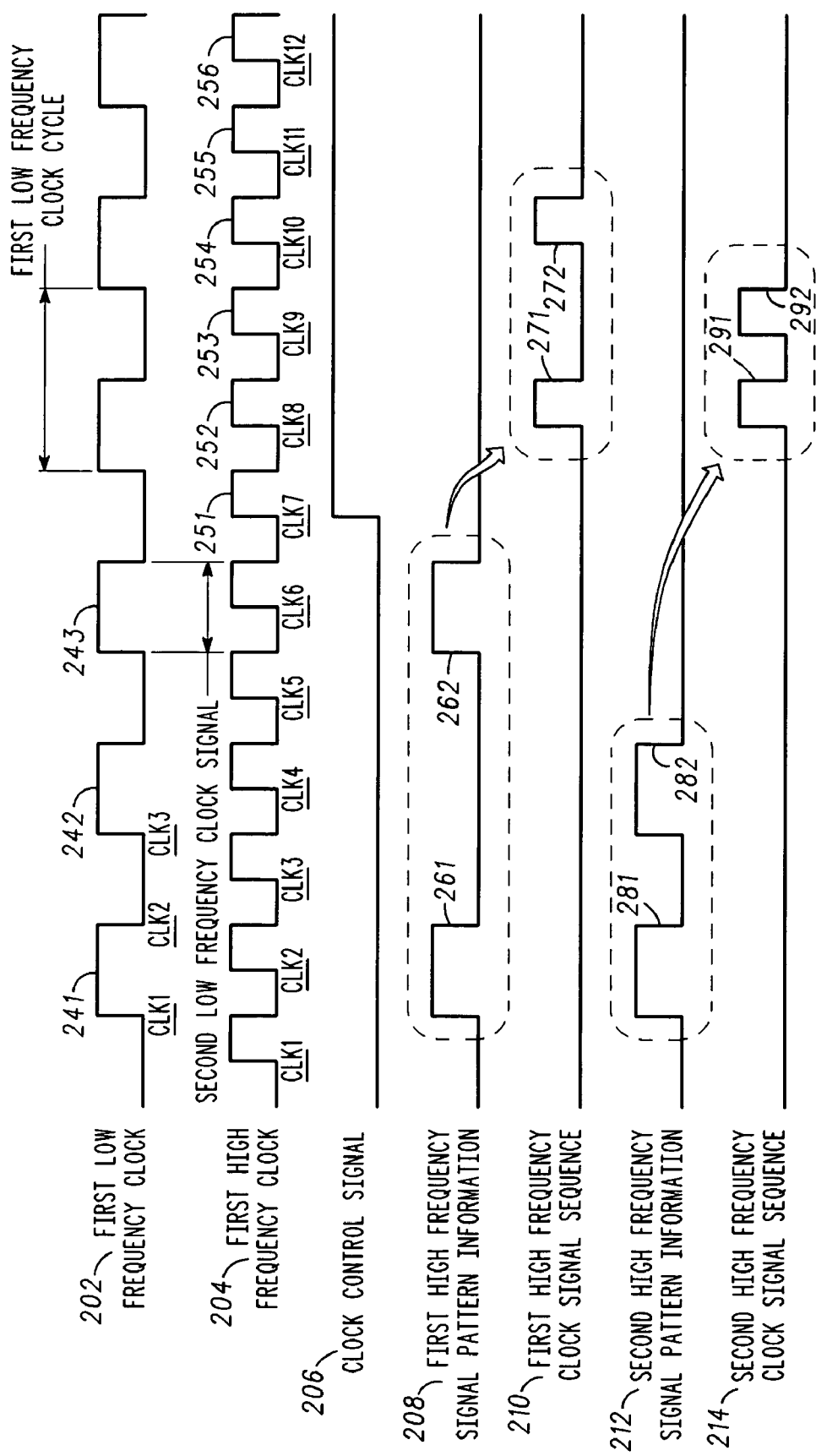
FIG. 3 illustrates various signals, according to an embodiment of the invention.

FIG. 3 is a timing diagram illustrates a first low frequency clock signal 202, a first high frequency clock signal 204, a clock control signal 206, a first high frequency signal pattern information 208, a first high frequency clock signal sequence 210, a second high frequency signal pattern information 212, and a second high frequency clock signal sequence 214, according to an embodiment of the invention.

FIG. 3 illustrates a 2:1 ratio between the high and low frequency clocks 202 and 204 but this is not necessarily so and other rations can be implemented.

The first low frequency signal 202 includes a series of low frequency clock pluses. The first three positive pulses, generated during the first three low frequency cycles (ckl1-ckl3) are denoted 241, 242 and 243.

The first high frequency signal 204 includes a series of high frequency clock signals generated during high frequency clock cycles such as clock cycles ckh1-ckh12. The seventh till twelve positive pulses, generated during ckh7-ckh12, are denoted 251-256.

The first high frequency signal pattern information 208 includes '101'. Assuming that it is provided to the first memory circuit 30 at a rate that corresponds to the first low frequency clock signal 202 then it includes a first pulse 261 that occurs during the first low frequency clock cycle ckl1 and a second pulse 262 that occurs during the third low frequency clock cycle ckl3.

The clock control signal 206 is asserted at the fourth clock cycle of the low frequency clock signal 202 and during the seventh clock cycle (ckh7) of the high frequency clock signal 204. This clock control signal 206 is conveniently negated after the $12^{th}$ clock cycle (ckh12) of the first high frequency clock signal 204.

The first high frequency clock signal sequence 210 is responsive to the '101'. The '101' sequence is retrieved at a retrieval rate that corresponds to the first high frequency. Accordingly, the first high frequency clock signal sequence 210 includes two positive pulses 271 and 272 that are generated during the eighth (ckh8) and the tenth (ckh10) clock cycles of the high frequency clock signal 204.

The second high frequency signal pattern information 212 includes '110'. Assuming that this information is provided to the second memory circuit 32 at a rate that corresponds to the first low frequency clock signal 202 then it includes a first pulse 281 that occurs during the first low frequency clock cycle ckl1 and a second pulse 282 that occurs during the second low frequency clock cycle ckl2.

The second high frequency clock signal sequence 214 is responsive to the '110' sequence. Said sequence is retrieved at a retrieval rate that corresponds to the first high frequency clock signal 204. Accordingly, the second high frequency clock signal sequence 214 includes two positive pulses 291 and 292 that are generated during the eighth (ckh8) and the ninth (ckh9) clock cycles of the high frequency clock signal 204.

Figure 4:
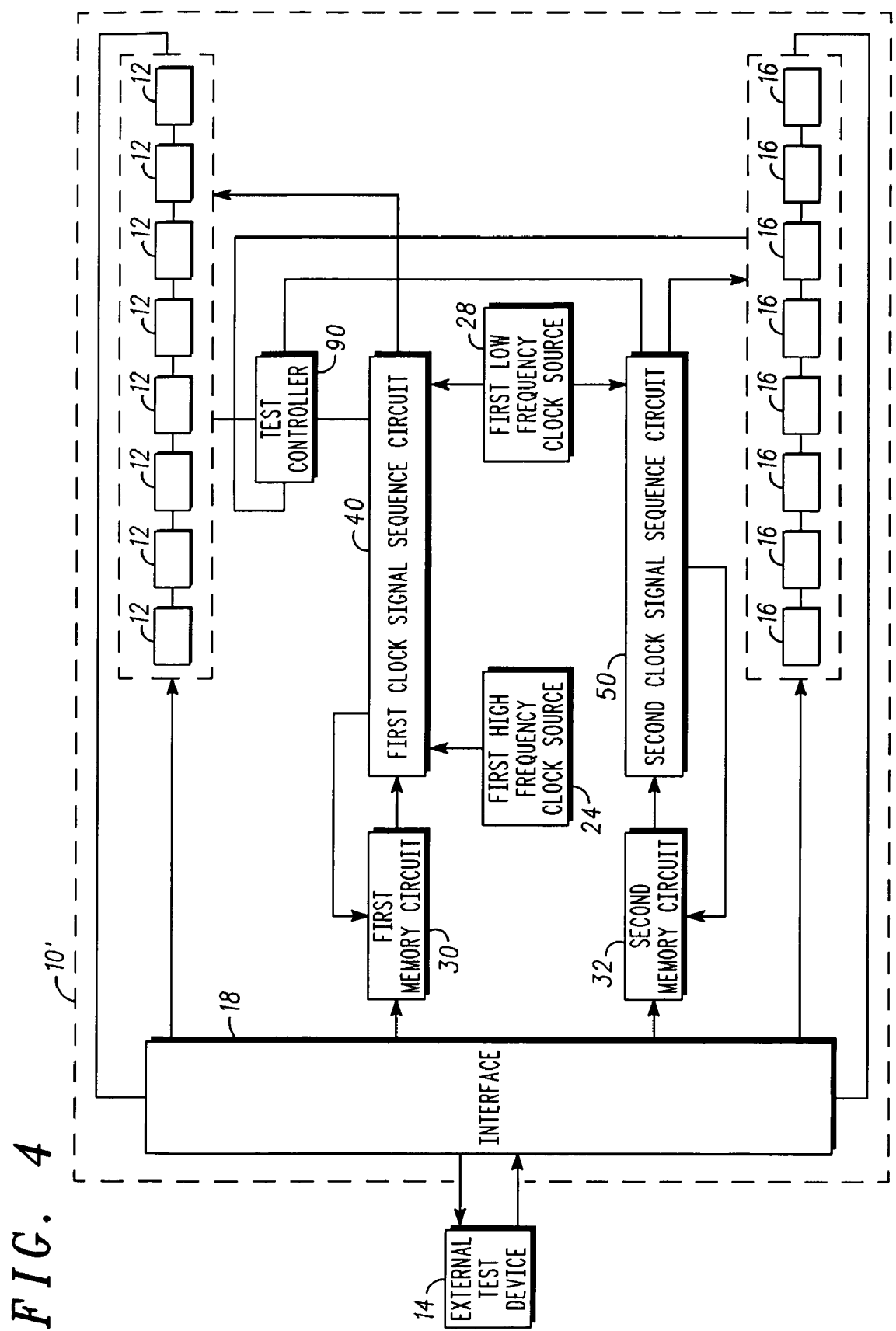
FIG. 4 illustrates an integrated circuit according to another embodiment of the invention.

FIG. 4 illustrates an integrated circuit 10' that is connected to an external test device 14, according to an embodiment of the invention.

Integrated circuit 10' includes only two clock sources, instead of three clock sources of integrated circuit 10. They can be fixed frequency clock sources of variable frequency clock sources, Assuming that each clock source provides a clock signal of a fixed frequency then integrated circuit 10' includes a high frequency clock signal source and a low frequency clock signal source. According to an embodiment of the invention, the second group of components 16 can only receive low frequency clock signal sequences.

Figure 5:
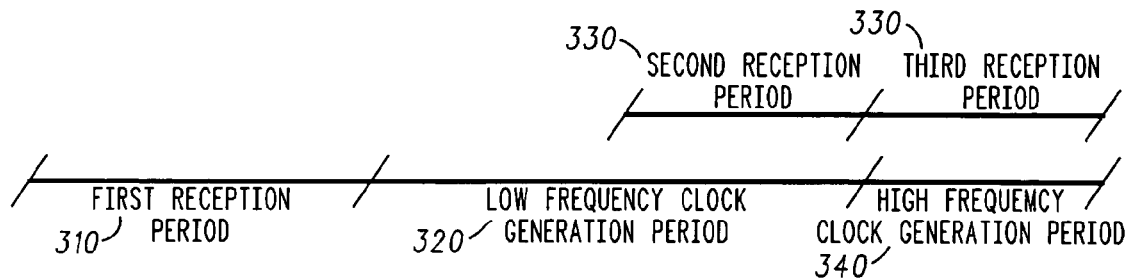
FIG. 5 is a timing diagram, according to an embodiment of the invention.

FIG. 5 is a timing diagram, according to an embodiment of the invention.

FIG. 5 provides a general illustration of various events that are being executed by the first memory circuit 30 and its environment.

The first memory circuit 30 first receives a low frequency signal pattern information during an first reception period 310.

The first memory circuit 30 then provides the low frequency signal pattern information to the first clock signal sequence circuit 40 that generates a low frequency clock signal sequence during a low frequency clock generation period 320.

The first memory circuit 30 receives, during a second reception period 330, that is conveniently included within the low frequency clock generation period 320, the first high frequency signal pattern information.

The low frequency clock generation period 320 is followed by a high frequency clock generation period 340 during which the first memory circuit 30 provides the high frequency signal pattern information to the first clock signal sequence circuit 40 that generates a high frequency clock signal sequence.

Conveniently, the first memory circuit 30 receives a low frequency signal pattern information during a third reception period 350 that is conveniently included within the high frequency clock generation period 340. The third reception period 350 is followed by a period such as the low clock generation period 320.

It is further noted that the mentioned above periods can be separated by one or more idle periods. Such an idle period can prevent errors resulting from different provision and retrieval rates. These differences can be managed by using a dual access memory circuit.

According to an embodiment of the invention the integrated circuit 10 constantly (or substantially constantly) receives signal pattern information from the external test device 14 at a low rate and retrieves this information at varying retrieval rates. Thus, the integrated circuit 14 does not need to ignore some of the signal pattern information provided by the external test device 14 and thus use in an efficient manner the flexibility and processing power of a typical external test tool.

Figure 6:
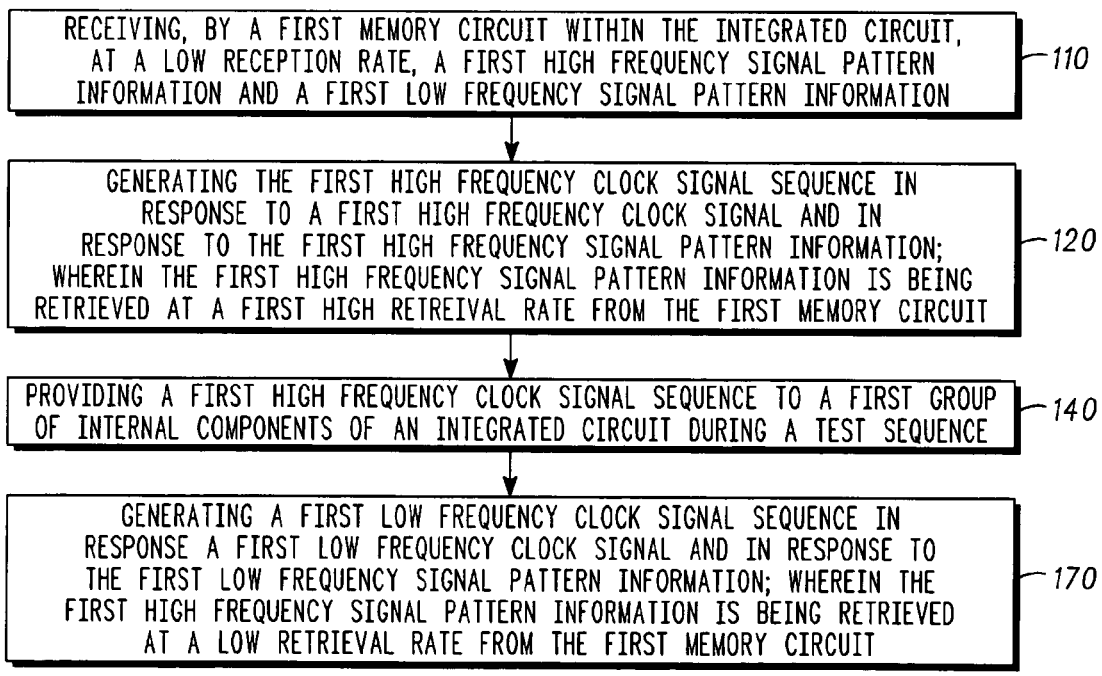
FIG. 6 illustrates a method according to an embodiment of the invention.

FIG. 6 illustrates a method (100) according to an embodiment of the invention.

For simplicity of explanation method 100 relates to a generation of one high frequency clock signal sequence but it is noted that method 100 can be applied to the generation of multiple clock signal sequences simultaneously (or at least at a partially overlapping manner) as illustrated by the exemplary configuration of integrated circuit 10.

Method 100 starts by stage 110 of receiving, by a first memory circuit within the integrated circuit, at a low reception rate, a first high frequency signal pattern information and a first low frequency signal pattern information.

Conveniently, stage 110 of receiving includes sequentially receiving the first high frequency signal pattern information and the first low frequency pattern information. Conveniently, stage 110 of receiving includes comprises receiving at least a portion of the first low frequency signal pattern information while retrieving at least a portion of the first high frequency signal pattern information Stage 110 is followed by stage 120 of generating the first high frequency clock signal sequence in response to a first high frequency clock signal and in response to the first high frequency signal pattern information; wherein the first high frequency signal pattern information is being retrieved at a first high retrieval rate from the first memory circuit.

Conveniently, stage 120 includes generating a first high frequency clock sequence and a second high frequency clock sequence. The second high frequency clock sequence can be provided to a second group of components of the integrated circuit during a test sequence. Conveniently, the second high frequency clock sequence is retrieved at a second high retrieval rate and the first high frequency clock sequence is retrieved at a first high retrieval rate that differs from the second high retrieval rate.

Conveniently, stage 120 includes applying at least one binary operation on the first high frequency clock signal and the retrieved first high frequency signal pattern information to provide the first high frequency clock signal sequence. Conveniently, the retrieving comprises receiving a first high frequency clock signal, a first low frequency clock signal and selecting one out of these clock signal as a first retrieval triggering signal.

Stage 120 is followed by stage 140 of providing a first high frequency clock signal sequence to a first group of components of an integrated circuit during a test sequence.

Stage 140 is followed by stage 170 of generating a first low frequency clock signal sequence in response a first low frequency clock signal and in response to the first low frequency signal pattern information; wherein the first high frequency signal pattern information is being retrieved at a low retrieval rate from the first memory circuit.

It is noted that some of the stages can overlap, as partially illustrated in FIG. 5.

Conveniently, the first high frequency signal pattern information is responsive to a desired length of the high frequency test.

Conveniently, stage 120 includes generating a first high frequency clock sequence and a second high frequency clock sequence. The second high frequency clock sequence can be provided to a second group of components of the integrated circuit during a test sequence. Conveniently, the second high frequency clock sequence is retrieved at a second high retrieval rate and the first high frequency clock sequence is retrieved at a first high retrieval rate that differs from the second high retrieval rate.

Conveniently, the first high frequency is at least double than the first low frequency.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A method for testing an integrated circuit, the method comprises:
providing a first high frequency clock signal by a first high frequency clock source of the integrated circuit;
receiving, by a first memory circuit within the integrated circuit, at a low reception rate, a first high frequency signal pattern information and a first low frequency signal pattern information;
generating the first high frequency clock signal sequence in response to a first high frequency clock signal and in response to the first high frequency signal pattern information, wherein the first high frequency signal pattern information is being retrieved at a first high retrieval rate from the first memory circuit;
providing the first high frequency clock signal sequence to a first group of components of an integrated circuit during a test sequence; and
generating a first low frequency clock signal sequence in response a first low frequency clock signal and in response to the first low frequency signal pattern information, wherein the first low frequency signal pattern information is being retrieved at a low retrieval rate from the first memory circuit.

2. The method according to claim 1 wherein the step of receiving, comprises sequentially receiving the first high frequency signal pattern information and the first low frequency pattern information.

3. The method according to claim 1 wherein the first high frequency signal pattern comprises a launch signal and a capture signal that are spaced apart from each other by a period that defines a high speed test period.

4. The method according to claim 3 and comprising generating a second high frequency clock sequence.

5. The method according to claim 4 wherein the second high frequency clock sequence is provided to a second group of components of the integrated circuit during a test sequence.

6. The method according to claim 4 wherein the second high frequency clock sequence is retrieved from a second memory unit of the integrated circuit at a second high retrieval rate, the first high frequency clock sequence is retrieved at the first high retrieval rate that differs from the second high retrieval rate, wherein the method further comprises providing the second high frequency clock signal sequence to a second group of components of the integrated circuit during a test sequence.

7. The method according to claim 1 wherein a first high frequency of the first high frequency clock signal sequence is at least double of a first low frequency of the first low frequency clock signal sequence.

8. The method according to claim 1 wherein the first group of components form at least one scan chain.

9. The method according to claim 1 wherein the receiving comprises receiving at least a portion of the first low frequency signal pattern information while retrieving at least a portion of the first high frequency signal pattern information.

10. The method according to claim 1 wherein generating the first high frequency clock signal sequence comprises applying at least one binary operation on the first high frequency clock signal and the retrieved first high frequency signal pattern information to provide the first high frequency clock signal sequence.

11. The method according to claim 1 comprising receiving a first high frequency clock signal, a first low frequency clock signal and selecting one out of these clock signal as a first retrieval triggering signal.

12. The method according to claim 1 wherein the first memory circuit is a first in first out memory circuit.

13. The method according to claim 1 wherein the first memory circuit is dual access memory circuit.

14. An integrated circuit that comprises:
a first group of components;
a first high frequency clock generator for generating a first high frequency clock signal;
a first memory circuit, adapted to receive at a low reception rate, a first high frequency signal pattern information and a first low frequency signal pattern information, wherein the first high frequency signal pattern information and the first low frequency signal pattern information are being provided from an external test device;
a first clock signal sequence circuit adapted to generate a first high frequency clock signal sequence in response to the first high frequency signal pattern information and in response to the first high frequency clock signal, wherein the first high frequency signal pattern information is being retrieved at a first high retrieval rate from the first memory circuit and provided to the first group of components; and
wherein the first clock signal sequence circuit is further adapted to generate a first low frequency signal sequence in response to the first low frequency signal pattern information and in response to a first low frequency clock signal; wherein the first low frequency signal pattern information is being retrieved at a low retrieval rate from the first memory circuit and provided to the first group of components.

15. The integrated circuit according to claim 14 adapted to sequentially receive the first high frequency signal pattern information and the first low frequency pattern information.

16. The integrated circuit according to claim 14, wherein the first high frequency signal pattern comprises a launch signal and a capture signal that are spaced apart from each other by a period that defines a high speed test period.

17. The integrated circuit according to claim 14, comprising a second clock signal sequence circuit and a second memory circuit, wherein the second memory circuit is adapted to receive at a retrieval rate, a second high frequency signal pattern information, wherein the second clock signal sequence circuit is adapted to generate a second high frequency clock signal sequence in response to the second high frequency signal pattern information, wherein the second high frequency signal pattern information is provided to the second group of components.

18. The integrated circuit according to claim 17, wherein the second clock signal sequence circuit retrieves a second clock signal pattern information at a second retrieval rate that differs from the first high retrieval rate.

19. The integrated circuit according to claim 14, wherein the integrated circuit comprises a second group of components 16 that receives a second clock signal sequence from a second clock signal sequence circuit.

20. The integrated circuit according to claim 14, wherein a first high frequency of the first high frequency clock signal sequence is at least double of a first low frequency of the first low frequency clock signal sequence.

21. The integrated circuit according to claim 14, wherein the first group of components form at least one scan chain that receive the first high frequency signal pattern information at a first high retrieval rate from the first memory circuit.

22. The integrated circuit according to claim 14, wherein the first memory circuit is adapted to receive at least a portion of the first low frequency signal pattern information while retrieving at least a portion of the first high frequency signal pattern information.

23. The integrated circuit according to claim 14, wherein the first clock signal sequence circuit is adapted to apply at least one binary operation on the first high frequency clock signal and the retrieved first high frequency signal pattern information to provide the first high frequency clock signal sequence.

24. The integrated circuit according to claim 14, wherein the first clock signal sequence circuit is adapted to receive a first high frequency clock signal, a first low frequency clock signal and select one out of these clock signals as a first retrieval triggering signal that triggers the retrieval of the first high frequency signal pattern information.

25. The integrated circuit according to claim 14, wherein the first memory circuit is a first in first out memory circuit.

26. The integrated circuit according to claim 14, wherein the first memory circuit is a dual access memory circuit.

* * * * *